United States Patent [19]

Yamamoto

[11] Patent Number: 5,786,277

[45] Date of Patent: Jul. 28, 1998

[54] METHOD OF MANUFACTURING A SEMICONDUCTOR DEVICE HAVING AN OXIDE FILM OF A HIGH QUALITY ON A SEMICONDUCTOR SUBSTRATE

[75] Inventor: Hironori Yamamoto, Tokyo, Japan

[73] Assignee: NEC Corporation, Tokyo, Japan

[21] Appl. No.: 720,376

[22] Filed: Sep. 27, 1996

[30] Foreign Application Priority Data

Sep. 29, 1995 [JP] Japan ................................ 7-252315

[51] Int. Cl.$^6$ ................................................ H01L 21/316
[52] U.S. Cl. ........................ 438/770; 438/906; 438/703
[58] Field of Search ......................... 437/228, 239, 437/946, 247; 134/1.3, 2, 3; 438/770, 795, 799, 974, 703, 906

[56] References Cited

U.S. PATENT DOCUMENTS

| 4,626,450 | 12/1986 | Tani et al. ............................ 437/247 |
| 4,637,123 | 1/1987 | Cazcarra et al. ..................... 437/239 |
| 4,954,189 | 9/1990 | Hahn et al. ......................... 437/2.28 |
| 5,028,560 | 7/1991 | Tsukamoto et al. ................. 437/946 |
| 5,098,866 | 3/1992 | Clark et al. ......................... 437/946 |
| 5,294,572 | 3/1994 | Granneman et al. ................. 134/2 |
| 5,589,422 | 12/1996 | Bhat .................................... 437/228 |

FOREIGN PATENT DOCUMENTS

| 62-7695 | 2/1987 | Japan | 437/239 |
| 62-51215 | 3/1987 | Japan | 437/239 |
| 63-226029 | 9/1988 | Japan | 437/239 |
| 1-297827 | 11/1989 | Japan | 437/239 |
| 4-68526 | 3/1992 | Japan . | |

*Primary Examiner*—Charles L. Bowers, Jr.
*Assistant Examiner*—Matthew Whipple
*Attorney, Agent, or Firm*—Foley & Lardner

[57] ABSTRACT

On manufacturing a semiconductor device comprising a semiconductor substrate having a principal surface and an objective oxide film on the semiconductor substrate, the semiconductor substrate is subjected to a heat treatment in an oxidizing atmosphere for a predetermined time duration to form a provisional oxide film on the principal surface at a first step. Subsequently, at a second step, the provisional oxide film is removed to expose the semiconductor substrate as an exposed surface of the semiconductor substrate by placing in a reducing atmosphere the semiconductor substrate with the provisional oxide film formed on the semiconductor substrate. Thereafter, the objective oxide film is formed on the exposed surface of the semiconductor substrate. Preferably, the heat treatment is carried out in the oxidizing atmosphere of an oxygen-partial pressure not higher than 5% at a temperature not lower than 950° C. for the predetermined time duration which is not shorter than fourty minutes. The reducing atmosphere may consist essentially of hydrogen. The first through the third steps may be carried out in a same furnace.

8 Claims, 5 Drawing Sheets

METHOD OF MANUFACTURING A SEMICONDUCTOR DEVICE HAVING AN OXIDE FILM OF A HIGH QUALITY ON A SEMICONDUCTOR SUBSTRATE

BACKGROUND OF THE INVENTION

This invention relates to a method of manufacturing a semiconductor device having an oxide film formed on a semiconductor substrate.

With a recent progress in obtaining a semiconductor device of a finer structure, a gate oxide film is made thinner. However, in case where heavy metals and particles exist on and in the near surface of a silicon crystal substrate, an oxide film formed thereon will have a different composition in a microscopic level. Inclusion of the heavy metals and the particles prevents a uniform oxide film from being formed and deteriorates an insulation characteristic of the gate oxide film. As a result, the yield of semiconductors is reduced. In view of the above, the improvement of a cleaning technique in a manufacturing process is required.

As such cleaning technique, there is a conventional method of cleaning a surface of a semiconductor substrate in a dry hydrogen atmosphere (for example, Tokkaihei 4-68526, namely, Japanese Unexamined Patent Publication No. 68526/1992). As will later be described, the conventional method is disadvantageous in that it is not possible to achieve a sufficient improvement in quality of the surface of the semiconductor substrate and the adjacent region and sufficient purification by cleaning. An objective oxide film of a high quality can form on the surface of the semiconductor substrate.

SUMMARY OF THE INVENTION

It is therefore an object of this invention to provide a method of manufacturing a semiconductor device having an objective oxide film of a high quality on a semiconductor substrate.

It is another object of this invention to provide a method of manufacturing an objective oxide film of a high quality, which method is capable of improving a quality of a surface of the semiconductor substrate and an adjacent region without occurrence of microroughness on the surface of the semiconductor substrate and contamination by heavy metals.

Other object of this invention will become clear as the description proceeds.

On describing the gist of this invention, it is possible to understand that a method is for manufacturing a semiconductor device comprising a semiconductor substrate having a principal surface and an objective oxide film on the semiconductor substrate.

According to this invention, the above-understood method comprises the steps of: subjecting the semiconductor substrate to a heat treatment in an oxidizing atmosphere for a predetermined time duration to form a provisional oxide film on the principal surface; removing the provisional oxide film to expose the semiconductor substrate as an exposed surface of the semiconductor substrate by placing in a reducing atmosphere the semiconductor substrate with the provisional oxide film formed on the semiconductor substrate; and forming the objective oxide film on the exposed surface of the semiconductor substrate.

The oxidizing atmosphere preferably has an oxygen-partial pressure not higher than 5%.

The heat treatment is preferably carried out at a temperature not lower than 950° C.

Preferably, the predetermined time duration is not shorter than fourty minutes.

Preferably, the reducing atmosphere consists essentially of hydrogen.

The subjecting step, the removing step, and the forming step are preferably carried out in a same furnace.

DESCRIPTION OF THE PREFERRED EMBODIMENTS

Figure 1:
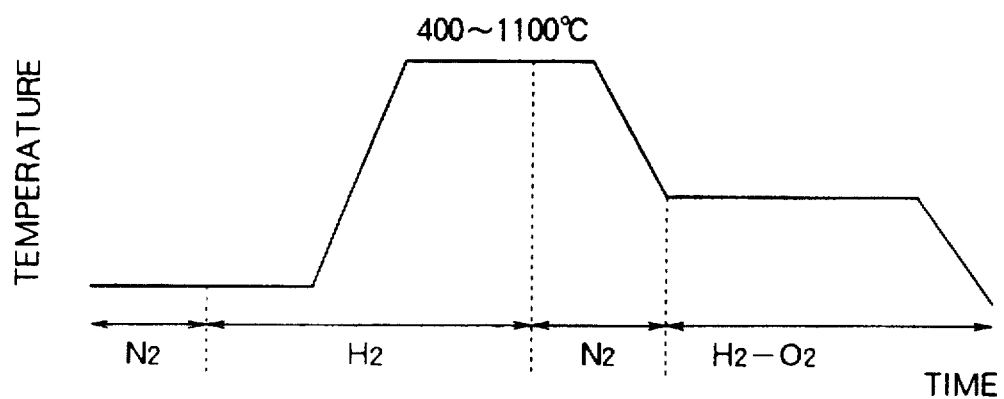
FIG. 1 is a view for use in describing a conventional method for cleaning a silicon wafer.

Referring to FIG. 1, a conventional method will first be described for a better understanding of this invention. The method is equivalent to the conventional method described in the preamble of the instant specification. The method is for cleaning a surface of a wafer in a dry hydrogen atmosphere. At first, a furnace is filled with an inert atmosphere ($N_2$). With the atmosphere maintained, a silicon wafer is introduced into the furnace. Thereafter, the atmosphere within the furnace is replaced by a hydrogen atmosphere to clean the surface of the silicon wafer by hydrogen. At this step, a temperature within the furnace is increased to a level between 400° and 1000° C. in order to promote a cleaning effect. Subsequently, after the hydrogen atmosphere is replaced by the inert atmosphere, a film forming step is carried out under the condition such that a desired film is obtained (in the example illustrated in FIG. 1, a thermal oxide film is formed in a wet oxidizing atmosphere). In this method, the film forming step is carried out in the same furnace following the cleaning step by hydrogen. Accordingly, there is no need to remove the silicon wafer out of the furnace. Thus, it is possible to reduce a possibility of contamination by the particles and the heavy metals.

However, in the above-mentioned conventional method, each step is carried out in the inert atmosphere or the hydrogen atmosphere. This means that the surface of the silicon wafer is exposed directly to a reducing atmosphere. As a result, the surface of the silicon wafer is reduced to increase occurrence of microroughness on the surface. Additionally, during the heat treatment in the reducing atmosphere such as the hydrogen atmosphere, a furnace material is reduced to cause heavy metals contained in the furnace material to be mixed in the atmosphere. In the above-mentioned conventional technique, the surface of the silicon wafer is not covered with an oxide film or the like at this stage and, therefore, such heavy metals are attracted to the surface of the silicon wafer. This makes it difficult to realize sufficient purification. The increase of the microroughness as well as the variation and the nonuniformity of the composition due to the contamination deteriorate the characteristic of the gate oxide film. This results in a reduction of the yield in manufacturing the semiconductor devices. As mentioned above, the conventional technique is disadvantageous in that it is not possible to achieve a sufficient improvement in quality of the surface of the silicon wafer and the adjacent region and sufficient purification by cleaning.

Description will proceed to a principle of a method of manufacturing a semiconductor device according to this invention.

A semiconductor substrate of, for example, a silicon wafer is introduced into a heat treatment furnace and subjected to a high-temperature heat treatment in a weak oxidizing atmosphere at 950° C. or more in order to promote the recovery of damages existing on a surface of the silicon wafer and the out diffusion of oxygen and microdefects. As a result, a provisional oxide film is formed on the silicon wafer. Thereafter, in order to remove the provisional oxide film formed on the silicon wafer, the atmosphere is replaced by a reducing atmosphere containing hydrogen and the temperature is lowered. Under the condition, the provisional oxide film on the silicon wafer is etched and removed. Thereafter, an objective oxide film (for example, a gate oxide film) is formed at a desired temperature.

More specifically, the furnace is filled with a weak oxidizing atmosphere (containing dry oxygen at a mixture rate not greater than 5%). The silicon wafer is introduced into the furnace. Herein, the weak oxidizing atmosphere is used because microroughness is generated on the surface of the silicon wafer in case where the heat treatment is carried out in the furnace filled with an inert gas or a hydrogen gas alone. Thereafter, the temperature in the furnace is increased with the weak oxidizing atmosphere maintained. Thus, a high-temperature weak oxidizing atmosphere at 950° C. or more is obtained and kept for at least fourty minutes. By keeping the temperature at 950° C. or more for at least fourty minutes, out diffusion of defects present on the surface of the silicon wafer is promoted and crystal damages are recovered so as to obtain a defect-free layer. By maintaining the weak oxidizing atmosphere, the provisional oxide film is formed on the surface of the silicon wafer to prevent the surface from being roughened. If a strong oxidizing atmosphere is used, the provisional oxide film has an increased thickness to inhibit out diffusion of the defects. Subsequently, a heat treatment is carried out in the reducing atmosphere containing hydrogen under the condition that the provisional oxide film formed in the high-temperature weak oxidizing atmosphere having the temperature and the duration described above can be etched and removed before the objective oxide film (the gate oxide film) is formed. During the heat treatment in the reducing atmosphere containing hydrogen, particles and heavy metals are removed together with the provisional oxide film reduced and etched. Thus, the silicon wafer is cleaned. At the time instant when the provisional oxide film is completely removed, hydrogen supply is stopped. Then, the atmosphere and the temperature in the furnace are changed to the conditions such that the objective oxide film (the gate oxide film) is obtained as desired. It takes no more than 5 minutes from the complete removal of the provisional oxide film formed on the surface to the start of formation of the objective oxide film (the gate oxide film).

In other words, the surface is covered with the provisional oxide film immediately before the formation of the objective oxide film (the gate oxide film) is started. It is therefore possible to prevent the generation of the microroughness on the surface of the silicon wafer and the contamination by the particles and the heavy metals. Through the above-mentioned series of steps, the silicon wafer can be partly modified into a defect-free layer. Thus, the gate oxide film of a high quality can be formed without being adversely affected by the microroughness or the contamination.

With reference to the drawing, description will now be made as regards a few preferred embodiments of this invention.

Figure 2:
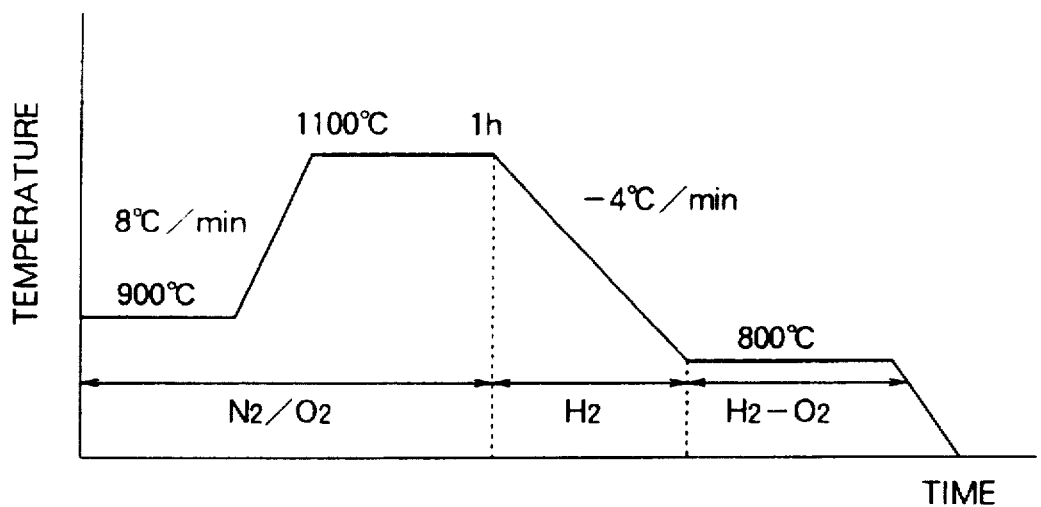
FIG. 2 is a view for use in describing a method of manufacturing a semiconductor device according to a first embodiment of this invention.
Figure 3A:
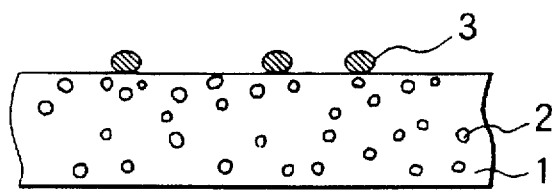
FIGS. 3A through 3E are sectional views of a semiconductor device in successive steps of the method illustrated in FIG. 2.
Figure 3B:
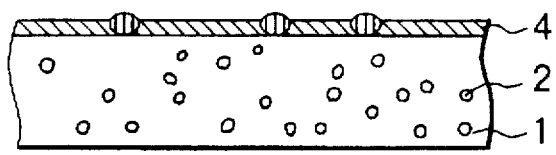
Figure 3C:
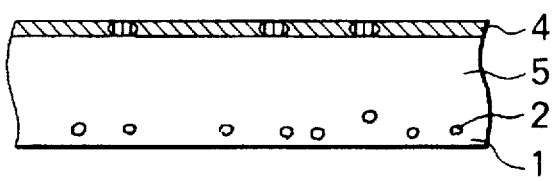
Figure 3D:
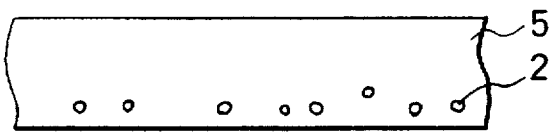
Figure 3E:
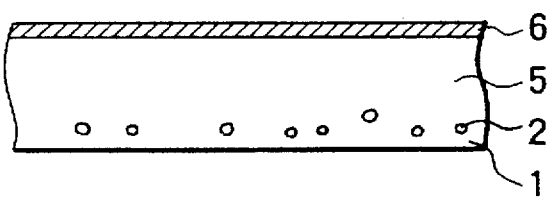

FIG. 2 shows a heat sequence of a method according to a first embodiment of this invention. FIG. 3A through 3E show a silicon wafer 1 in section in successive steps of forming the gate oxide film. Referring to FIGS. 2 and 3A through 3E, the process will be described in order. After the 6-inch P-type silicon wafer 1 was cleaned by the use of chemicals, microdefects 2 were contained in silicon wafer 1 in the vicinity of its surface and a trace of heavy metal contaminants 3 were present on the surface of the silicon wafer 1, as illustrated in FIG. 3A. The silicon wafer 1 was introduced into a furnace kept in a weak dry oxidizing atmosphere (having an oxygen partial pressure of 2%) at a temperature of 900° C. Thereafter, the temperature was increased up to 1100° C. at the rate of 8° C./min. By keeping the weak oxidizing atmosphere when the silicon wafer 1 was introduced into the furnace, a provisional oxide film 4 was formed on the silicon wafer 1 as illustrated in FIG. 3B so that the surface of the silicon wafer 1 was prevented from being roughened or damaged. With the weak oxidizing atmosphere (having the oxygen partial pressure of 2%) maintained, the silicon wafer 1 was annealed at 1100° C. for one hour. This annealing caused out diffusion of the microdefects 2 in the near surface of the silicon wafer 1 to form a defect-free layer 5 as illustrated in FIG. 3C. During this heat treatment, the oxide film 4 having a thickness of 22 nm was formed on the surface of the silicon wafer 1. The heavy metal contaminants 3 were confined in the oxide film 4. Then, the weak oxidizing atmosphere was replaced by a 100%-hydrogen atmosphere and the temperature was decreased from 1100° C. to 800° C. at the rate of 4° C./min. In this condition, the oxide film 4 formed on the silicon wafer 1 was removed together with the heavy metal contaminants 3 to clean the surface of the silicon wafer 1, as shown in FIG. 3D. Thereafter, the hydrogen atmosphere was replaced by a water vapor atmosphere to form a gate oxide film (an objective oxide film) 6 at 800° C. to a thickness of 20 nm, as illustrated in FIG. 3E. The gate oxide film 6 has a high electrical insulating voltage.

Figure 4:
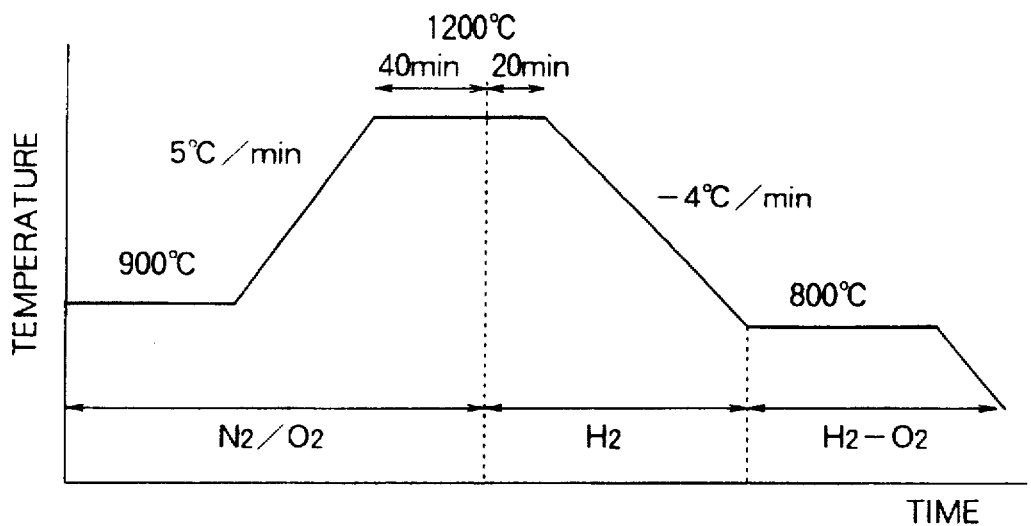
FIG. 4 is a view for use in describing a method of manufacturing a semiconductor device according to a second embodiment of this invention.

FIG. 4 shows a heat sequence of a method according to a second embodiment of this invention. Referring to FIG. 4 together with FIGS. 3A through 3E, the process will be described in order. After a 6-inch P-type silicon wafer 1 was cleaned by the use of chemicals (FIG. 3A), the silicon wafer 1 was introduced into a furnace kept in a weak dry oxidizing atmosphere (having an oxygen partial pressure of 5%) at temperature of 900° C . Thereafter, the temperature was increased up to 1200° C. at the rate of 5° C./min (FIG. 3B). With the weak oxidizing atmosphere (having the oxygen partial pressure of 5%) maintained, the silicon wafer 1 was annealed at 1200° C. for 40 minutes. By this annealing, an oxide film 4 having a thickness of 42 nm was formed on a surface of the silicon wafer 1 (FIG. 3C). Subsequently, the weak oxidizing atmosphere was replaced by a hydrogen atmosphere in which annealing was performed at 1200° C.

for 20 minutes. Thereafter, the temperature was decreased from 1200° C. down to 800° C. at the rate of 4° C./min (FIG. 3D). In this embodiment, the weak oxidizing atmosphere was replaced by the hydrogen atmosphere at the high temperature of 1200° C. as described above. This is because the oxide film 4 was thick as compared with the first embodiment and can not be completely removed in the hydrogen atmosphere only after the temperature was decreased to 800° C., resulting in a less cleaning effect. After the temperature was decreased down to 800° C., a gate oxide film 6 was formed to a thickness of 20 nm in the condition similar to that in the first embodiment (FIG. 3E).

Figure 5:
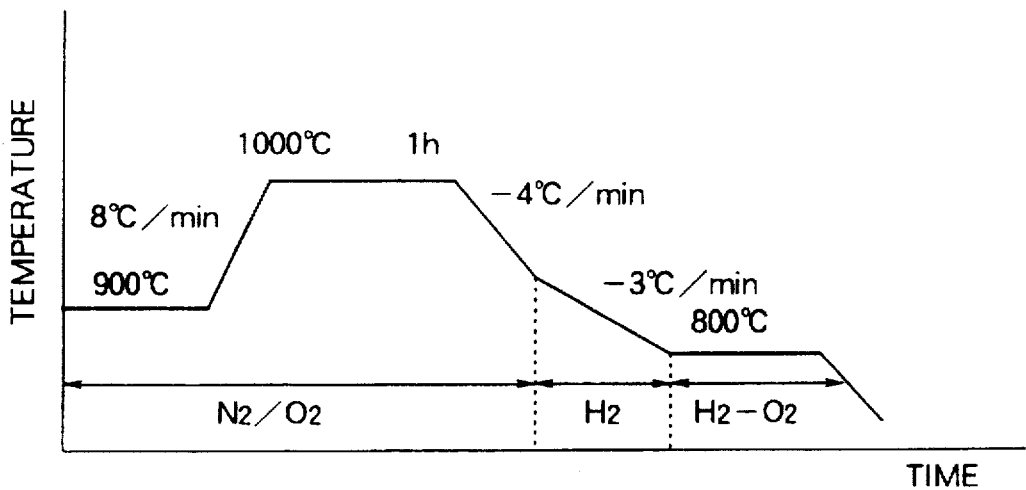
FIG. 5 is a view for use in describing a method of manufacturing a semiconductor device according to a third embodiment of this invention.

FIG. 5 shows a heat sequence of a method according to a third embodiment of this invention. Referring to FIG. 5 together with FIGS. 3A through 3E, the process will be described in order. After a 6-inch P-type silicon wafer 1 was cleaned by the use of chemicals (FIG. 3A), the silicon wafer 1 was introduced into a furnace kept in a weak dry oxidizing atmosphere (having an oxygen partial pressure of 1%) at a temperature of 900° C. Thereafter, the temperature was increased up to 1000° C. at the rate of 8° C./min (FIG. 3B). With the weak oxidizing atmosphere (having the oxygen partial pressure of 1%) maintained, the silicon wafer 1 was annealed at 1000° C. for one hour. Thereafter, the temperature was decreased from 1000° C. down to 950° C. at the rate of 4° C./min. By this annealing, an oxide film 4 having a thickness of 15 nm was formed on a surface of the silicon wafer 1 (FIG. 3C). Subsequently, the weak oxidizing atmosphere was replaced by a hydrogen atmosphere and the temperature was decreased down to 800° C. at the rate of 3° C./min (FIG. 3D). In this embodiment, the weak oxidizing atmosphere was replaced by the hydrogen atmosphere in the middle of the decrease of the temperature. This is because the oxide film 4 was relatively thin and would have been overetched if the weak oxidizing atmosphere was replaced by the hydrogen atmosphere at the start of the decrease of the temperature, resulting in temporal exposure of the silicon wafer 1 to a reducing atmosphere to bring about a possibility of occurrence of microroughness or heavy metal contamination. After the temperature was decreased down to 800° C., a gate oxide film 6 having a thickness of 20 nm was formed in the condition similar to that in the first embodiment (FIG. 3E).

In order to evaluate the electric insulating properties of the gate oxide film 6 formed on the silicon wafer 1, wiring and the like was formed on the gate oxide film 6 obtained in each of the first, the second, and the third embodiments to carry out TDDB (time dependant dielectric breakdown) measurement. TDDB measurement was carried out for a measurement area of 10 mm² at an injected current density of 0.01 A/cm².

Figure 6:
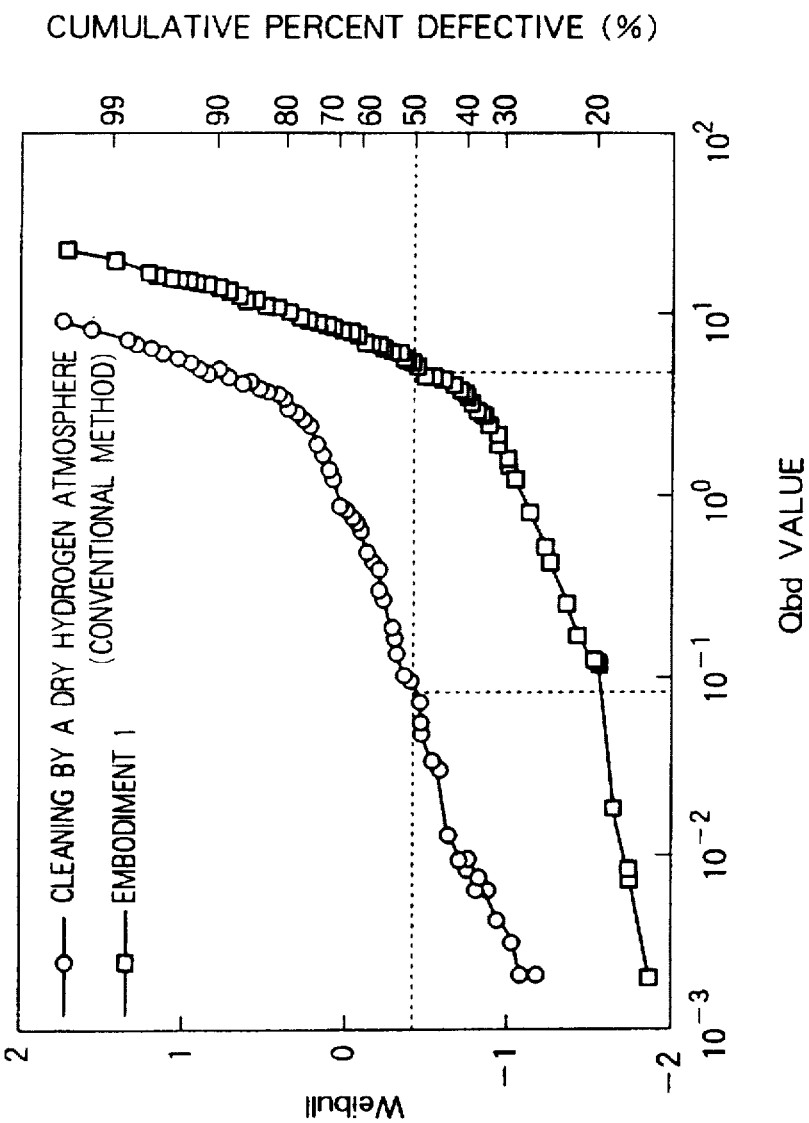
FIG. 6 is a Weibull-plotted diagram for Qbd values of a gate oxide film obtained in the first embodiment of this invention and in the conventional process.

The result of TDDB measurement is shown in FIG. 6 as a Weibull-plot chart in conjunction with the gate oxide film obtained in the first embodiment of this invention and, for comparison, the gate oxide film obtained by the conventional method in which the surface of the wafer was cleaned in the dry hydrogen atmosphere. Both in an intrinsic mode and a defective mode, the gate oxide film obtained in the embodiment of this invention exhibited an excellent result as compared with that formed by the conventional method. Table 1 shows Qbd values (Q50) at a cumulative percent defective of 50%. In comparison of Q50 also, the gate oxide film obtained in each of the embodiments of this invention had a Q50 value approximately 75 to 80 times higher than that of the gate oxide film obtained in the conventional method.

TABLE 1

| | THIS INVENTION | | | CONVENTIONAL METHOD CLEANING |
|---|---|---|---|---|
| | EMBODI-MENT 1 | EMBODI-MENT 2 | EMBODI-MENT 3 | IN DRY HYDROGEN ATMOSPHERE |
| Q50 | 6.2 | 6.4 | 6.1 | 0.08 |
| | | | | (C/cm²) |

Figure 7:
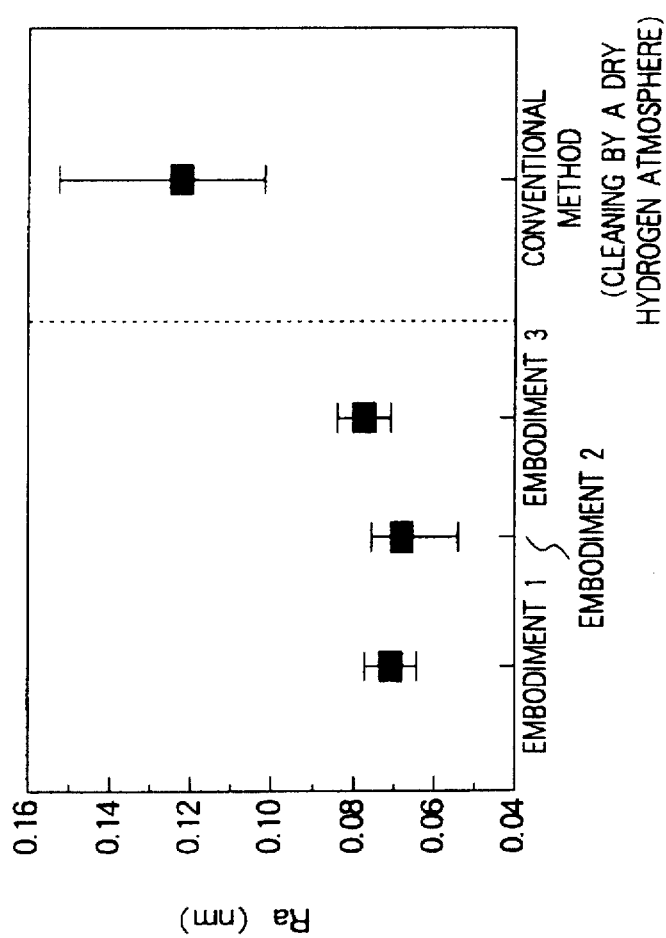
FIG. 7 is a diagram showing a roughness average (Ra) of a surface of a silicon wafer in each of the first, the second, and the third embodiments of this invention and the conventional method.

FIG. 7 shows the microroughness of the surface of the silicon wafer in each of the first through the third embodiments and the conventional method. The microroughness was measured by AFM after the gate oxide film was completely etched by the use of HF. The roughness average (Ra) is shown in FIG. 7. It is understood from FIG. 7 that Ra in this invention is approximately equal to half of that in the conventional method. Thus, the microroughness is also improved in this invention.

Table 2 shows the heavy metal contamination on the surface of the silicon wafer in each of the first through the third embodiments and the conventional method. The measurement was carried out by the atomic absorption spectroscopy. As seen from Table 2, the heavy metal contamination was on the order of $10^{10}$ atoms/cm² in the conventional method while in the first, the second, and the third embodiments, the amounts of Cr and Ni were below the detection limit and the amount of Fe was smaller than that detected in case of the conventional method. Thus, in this invention, improvement is made also in the heavy metal contamination.

TABLE 2

| | THIS INVENTION | | | CONVENTIONAL METHOD |
|---|---|---|---|---|
| | EMBODI-MENT 1 | EMBODI-MENT 2 | EMBODI-MENT 3 | CLEANING IN DRY HYDROGEN ATMOSPHERE |
| Fe | 0.53 | 0.64 | 0.48 | 0.73 |
| Cr | N.D | N.D | N.D | 0.34 |
| Ni | N.D | N.D | N.D | 1.66 |

N.D: below the detection limit ($10^{10}$ atoms/cm²)

In the embodiments of this invention, the high-temperature heat treatment was carried out with the temperature and the composition of the atmosphere fixed. However, it will be understood that the similar effect is obtained even if these conditions are changed during the high-temperature heat treatment, as far as the temperature is varied within a range not lower than 950° C. and the oxygen partial pressure in the atmosphere is varied within a range not higher than 5%.

What is claimed is:

1. A method of manufacturing a semiconductor device comprising a semiconductor substrate having a principal surface and an objective oxide film on said semiconductor substrate, said method comprising the steps of:

placing said semiconductor substrate within a furnace chamber;

subjecting said semiconductor substrate to an oxidizing atmosphere within said furnace chamber and increasing the temperature of said oxidizing atmosphere to a first temperature to form a provisional oxide film on said principal surface;

removing said provisional oxide film to reveal an exposed surface of said semiconductor substrate by subjecting said provisional oxide film to a reducing atmosphere within said furnace chamber and decreasing the temperature of said reducing atmosphere from said first temperature to a second temperature lower than said first temperature; and forming said objective oxide film on said exposed surface of the semiconductor substrate in said furnace chamber at said second temperature.

2. A method of manufacturing a semiconductor device as claimed in claim 1, wherein said oxidizing atmosphere has an oxygen-partial pressure not higher than 5%.

3. A method of manufacturing a semiconductor device as claimed in claim 1, wherein said first temperature is not lower than 950° C.

4. A method of manufacturing a semiconductor device as claimed in claim 1, wherein said semiconductor substrate is subjected to said oxidizing atmosphere at said first temperature for not less than forty minutes.

5. A method of manufacturing a semiconductor device as claimed in 1, wherein said reducing atmosphere consists essentially of hydrogen.

6. A method of manufacturing a semiconductor device as claimed in claim 1, wherein said reducing atmosphere is introduced to said furnace chamber at said first temperature and then reduced to said second temperature.

7. A method of manufacturing a semiconductor device comprising the steps of:

placing a semiconductor substrate within a furnace chamber;

subjecting said semiconductor substrate to heat treatment in a dry oxidizing atmosphere within said furnace chamber and increasing the temperature of said dry oxidizing atmosphere to a first temperature to form a provisional oxide film on said semiconductor substrate;

removing said provisional oxide film from said semiconductor surface by subjecting said semiconductor substrate to a reducing atmosphere within said furnace chamber and decreasing the temperature of said reducing atmosphere from said first temperature to a second temperature lower than said first temperature; and forming an objective oxide film on said semiconductor substrate in said furnace chamber at said second temperature.

8. A method of manufacturing a semiconductor device comprising the steps of:

placing a semiconductor substrate within a furnace chamber;

subjecting said semiconductor substrate to heat treatment in a dry oxidizing atmosphere within said furnace chamber and increasing the temperature of said dry oxidizing atmosphere to a first temperature to form a provisional oxide film on said semiconductor substrate;

reducing the temperature of said dry oxidizing atmosphere in said furnace chamber to a second temperature that is less than said first temperature;

removing said provisional oxide film from said semiconductor surface by subjecting said semiconductor substrate to a reducing atmosphere within said furnace chamber at said second temperature and decreasing the temperature of said reducing atmosphere from said second temperature to a third temperature lower than said first temperature; and forming an objective oxide film on said semiconductor substrate in said furnace chamber at said third temperature.

* * * * *